US006088227A

United States Patent [19]

Bujtas et al.

[11] Patent Number: 6,088,227

[45] Date of Patent: Jul. 11, 2000

[54] HEAT SINK WITH INTEGRATED BUSS BAR

[75] Inventors: Geza Bujtas, Holmdel; Robert A. Hupp, Manville, both of N.J.

[73] Assignee: Smiths Industries Aerospace and Defense Systems, Inc., Grand Rapids, Mich.

[21] Appl. No.: 08/973,229

[22] PCT Filed: Jun. 7, 1995

[86] PCT No.: PCT/US95/07339

§ 371 Date: May 22, 1998

§ 102(e) Date: May 22, 1998

[87] PCT Pub. No.: WO96/41510

PCT Pub. Date: Dec. 19, 1996

[51] Int. Cl.$^{7}$ .......... H05K 7/20

[52] U.S. Cl. .......... 361/719; 361/775

[58] Field of Search .......... 257/706, 707, 257/713, 714, 718; 165/80.3, 185; 174/16.3, 252; 361/704, 707, 709–712, 717–719, 721, 722, 725, 784

[56] References Cited

U.S. PATENT DOCUMENTS

| | | |
|---|---|---|
| 4,346,257 | 8/1982 | Moss . |
| 5,132,896 | 2/1992 | Nishizawa . |
| 5,172,310 | 12/1992 | Deam . |

FOREIGN PATENT DOCUMENTS

| | | |
|---|---|---|
| 0064856 | 11/1982 | European Pat. Off. . |
| 0277546 | 8/1988 | European Pat. Off. . |
| 2107526 | 4/1983 | United Kingdom . |
| 94-14227 | 6/1994 | WIPO . |

*Primary Examiner*—Gerald Tolin
*Attorney, Agent, or Firm*—Varnum, Riddering, Schmidt & Howlett LLP

[57] ABSTRACT

The invention centers around a circuit board assembly having a heat sink with a buss bar integrally formed therein. The heat sink is provided between two parallel, opposed circuit boards. The buss bar is provided between the two circuit boards and is in electrical contact with circuit modules provided on both circuit boards. The buss bar is electrically insulated from both the circuit boards and the heat sink but electrically connected to the circuit modules.

12 Claims, 2 Drawing Sheets

68
62
68
60
66
66
48
54
56
64
56
58
56
52
20
70
58
50
46
34
40
36
42
72
38
30
32

HEAT SINK WITH INTEGRATED BUSS BAR

BACKGROUND OF THE INVENTION

1. Field of the Invention

This invention relates to electrical circuit boards and, more particularly, to a circuit board assembly having a buss bar for distributing electrical current to several circuit modules provided on the circuit board and a heat sink for thermally conducting heat away from the circuit modules.

2. Description of the Related Art

Circuit boards are typically made of an electrically insulating material and have multiple circuit modules mounted thereon. It is known to use multiple buss bars mounted on the front surface of the circuit board to conduct electrical current from a suitable source to multiple modules mounted on the front surface of the circuit board. It is also known to provide a heat sink adjacent the modules in order to thermally conduct heat away from the circuit board in order to protect the modules from the high heat generated as a result of the current flow through the modules.

It is desirable to incorporate buss bars into a circuit board for the efficient distribution of current from a single source to the multiple modules. Preferably, the number of buss bars would be minimized to reduce weight and material cost.

SUMMARY OF THE INVENTION

The heat sink with an integrated buss bar according to the invention overcomes the problems of the prior art by permitting the utilization of a single buss bar for supplying electrical current to a large number of modules of an electrical circuit while providing means for effectively thermally conducting the heat generated in the electrical circuit away from the modules of the circuit board.

In one aspect, the invention comprises an electric circuit board assembly incorporating at least one circuit board, wherein multiple circuit modules are provided on the board. A buss bar is used to conduct electrical current from a suitable source of power to each of the circuit modules. The buss bar is provided between the two circuit boards and has multiple terminals formed thereon which are electrically connected to the circuit modules on both the circuit boards. A heat sink is also provided between the two circuit boards, and has at least one aperture provided therein to receive at least one of the buss bar terminals extending from the buss bar to one of the circuit modules of the second circuit board. The heat sink is adapted to thermally conduct heat away from the circuit modules.

Preferably, the heat sink also has a depression formed in the front surface thereof wherein the buss bar is received, at least in part, in the depression.

In another embodiment, the buss bar is electrically insulated from the heat sink and circuit boards.

In another aspect, the invention comprises an electrical circuit board assembly incorporating two circuit boards wherein each board has at least one circuit module provided thereon and each board has an outer edge. A buss bar is provided between the two circuit boards and has multiple terminals provided thereon. The terminals are electrically connected to the circuit modules on both the first and second circuit boards. A heat sink is also provided between the two circuit boards immediately adjacent to the buss bar. The heat sink extends outwardly from the circuit boards and has an outer edge extending beyond the outer edge of the circuit boards. The outer edge is adapted to contact the frame of a supporting chassis to thermally conduct heat away from the buss bar and circuit modules to the frame.

BRIEF DESCRIPTION OF THE DRAWINGS

The invention will now be described with reference to the drawings in which.

DETAILED DESCRIPTION OF THE PREFERRED EMBODIMENTS

Figure 1:
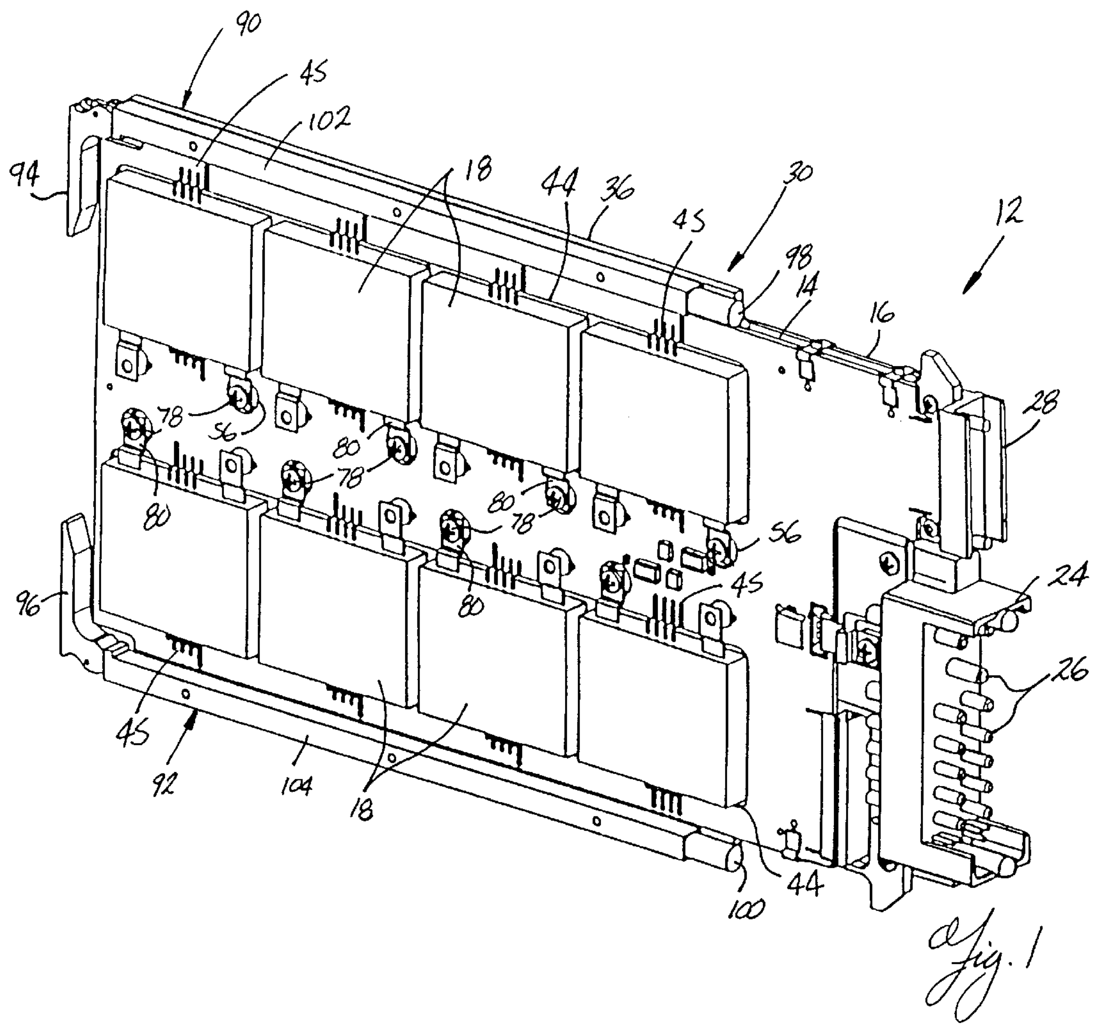
FIG. 1 is a perspective view of an electrical circuit board incorporating the heat sink and buss bar according to the invention.
Figure 2:
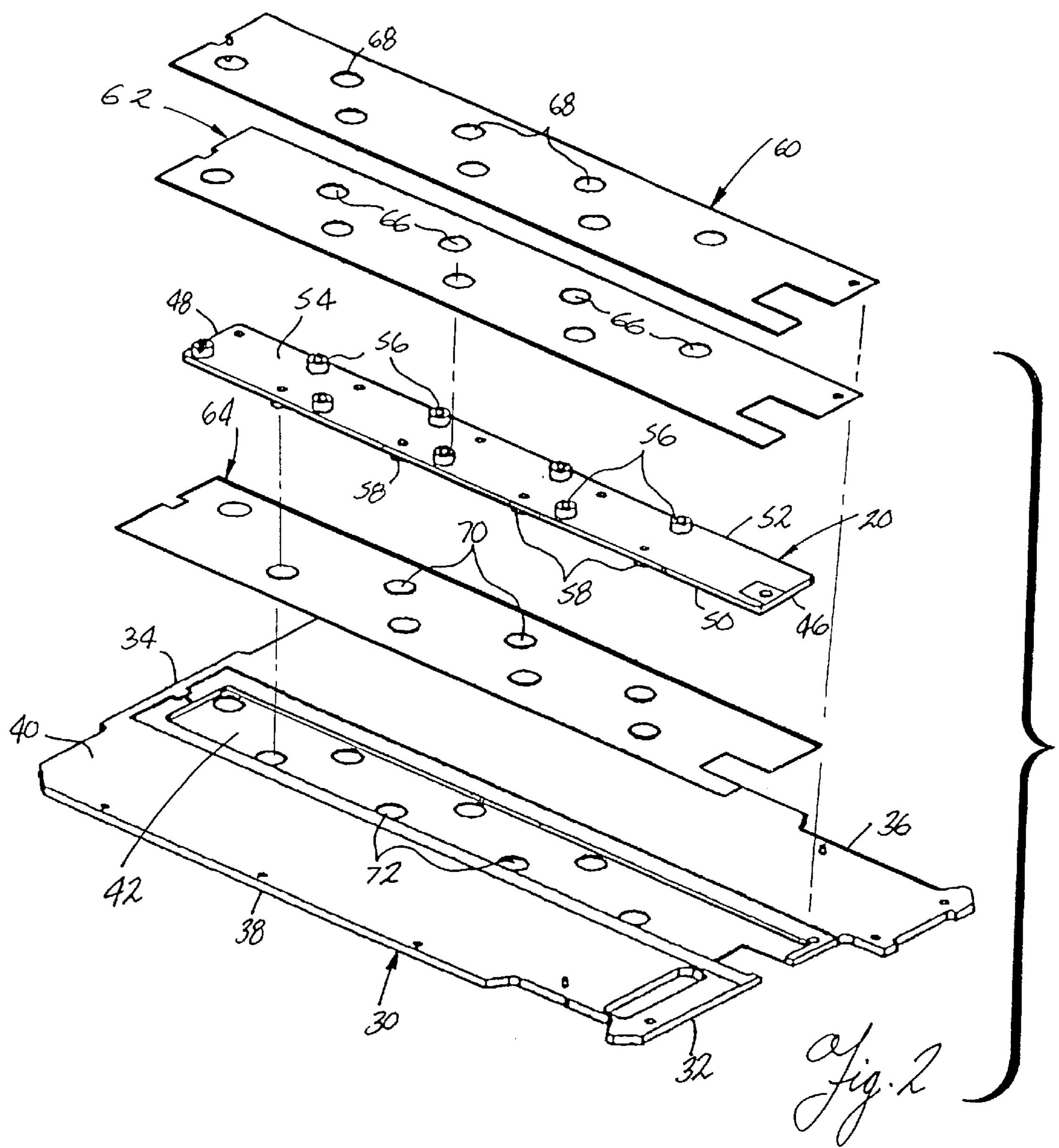
FIG. 2 is an exploded, perspective view of the heat sink and buss bar assembly according to the invention.

Referring now to the drawings and to FIGS. 1 and 2 in particular, a circuit board assembly 12 having an integrated heat sink and buss bar according to the invention is shown. The circuit board assembly 12 comprises first and second circuit boards 14, 16, respectively, provided parallel to and closely adjacent to one another. Each circuit board has a plurality of circuit modules 18 provided adjacent thereto and electrically connected thereto by conventional connections 45. Each of the modules 18 is electrically connected to a single buss bar 20 which is in turn selectively connected to a conventional power source (not shown). The particular structure of the circuit modules 18 is not critical to the invention and therefore will not be described in detail. In the preferred embodiment, the circuit board assembly is formed from two circuit boards. It is within the scope of this invention to utilize a single circuit board or more than two boards.

A conventional power terminal 24 is provided on one end of the circuit board assembly 12. The terminal 24 has a plurality of pins 26 provided thereon for providing suitable electrical connections. A conventional signal terminal 28 is also provided on the circuit board assembly adjacent the power terminal. The signal terminal is electrically connected to the circuit modules 18 and adapted to conduct electrical signals thereto.

A heat sink 30 is provided between the first and second circuit boards 14, 16. As described further below, the heat sink is adapted to thermally conduct heat away from the circuit boards 14, 16 and modules 18 provided thereon. The heat sink 30 is substantially planar and has a front edge 32, a rear edge 34 and a pair of opposed side edges 36, 38. The heat sink 30 further comprises a top surface 40, a bottom surface (not shown) and a depression, pocket or recess 42 provided in the top surface 40 for receipt of the buss bar 20. Preferably, the depression 42 is complementary to the shape of the buss bar 20 and has a sufficient depth to receive at least a portion of, if not all of, the entire thickness of the buss bar 20 therein. Preferably, the circuit modules 18 are mounted to the front and rear surfaces of the heat sink by a conventional thermally conductive adhesive (not shown). Module apertures 44 are provided in the circuit boards 14, 16 so that the modules 18 extend outwardly beyond the exposed surfaces of the circuit boards 14, 16. The heat sink is preferably formed from aluminum. However, any thermally conductive material is suitable.

The buss bar 20 comprises a front edge 46, a rear edge 48, a pair of opposed side edges 50, 52 and top 54 and bottom surfaces extending between the several edges. A plurality of buss bar terminals 56, 58 protrude laterally from the top and bottom surfaces, respectively, of the buss bar. The terminals are preferably integrally formed with the buss bar. However, the terminals can be mounted to the buss bar by conventional methods including welding or brazing. As described further below, the several terminals are electrically connected to the circuit modules 18 provided on the first and second circuit boards 14, 16. Preferably, the buss bar and terminals are formed from copper. However, any electrically conductive material can be utilized.

The buss bar 20 is received in the depression 42 and enclosed therein by a cover 60 which is secured to the heat sink 30 by a conventional adhesive. Preferably, the buss bar 20 is electrically insulated from the cover 60 and heat sink 30 by conventional insulation means. In FIG. 2, the buss bar 20 is insulated from the cover 60 and heat sink 30 by a pair of sheets of insulating film 62, 64 provided between the buss bar 20 and the cover 60 and heat sink 30, respectively. Examples of suitable material for the insulating film include TEDLAR™ and KAPTON™. Alternatively, the buss bar or adjacent components, could be electrically insulated by coating with a conventional epoxy powder coating. The insulating film 62 and cover 60 have terminal apertures 66, 68, respectively, formed therein which are adapted to receive the buss bar terminals 56. Similarly, the insulating film 64 and heat sink 30 have terminal apertures 70, 72 which are adapted to receive the buss bar terminals 58 protruding from the bottom surface (not shown) of the buss bar 20. The buss bar terminals 56, 58 extend through apertures 74 formed on the circuit boards 14, 16 such that the terminals are exposed and available for connection to the circuit modules 18.

The circuit modules 20 are electrically connected to the buss bar terminals 56, 58 by conventional fasteners 78 which secure conventional electrical leads 80 of the modules 20 to the terminals 56, 58. Although the preferred embodiment discloses terminals 56, 58 which protrude outwardly from the buss bar 20, it is certainly within the scope of the invention to provide electrical conduits which protrude inwardly from the circuit modules 18 to contact the buss bar 20.

As seen in FIG. 1, a single buss bar 20 is utilized to distribute electrical current to multiple circuit modules 18 on the first circuit board 14. Similarly, multiple circuit modules 18 are provided on the second circuit board all of which can be electrically connected to the same buss bar 20. In the preferred embodiment, 16 different circuit modules, eight on the first circuit board 14 and eight on the second circuit board 16, are electrically connected to the buss bar 20.

As noted above, the first and second circuit boards 14, 16 are provided closely adjacent to one another with the heat sink, buss bar 20 and cover 60 provided intermediate the two circuit boards 14, 16. The side edges 36, 38 of the heat sink extend beyond the top and bottom sides 84, 86 and 88 of the first and second circuit boards 14, 16. The side edges 36, 38 of the heat sink 30 are adapted to contact the conventional rails (not shown) of the chassis which receive the circuit board and thermally conduct the heat generated in the circuit board assembly 12 to the chassis. Conventional wedge clamps 90, 92 are provided on the top and bottom side edges 36, 38 of the heat sink for maximizing the contact pressure between the top and bottom edges of the heat 20 sink and the chassis rails. The wedge clamps 90, 92 comprise actuator levers 94, 96 which are interconnected to translating shafts 98, 100 received inside a cam housing 102, 104. As the actuator lever 94, 96 is rotated from the relaxed position to the engaged position as seen in FIG. 1, the shafts 98, 100 translate thereby causing cam members provided inside the cam housing 102, 104 to slide with respect to one another thereby expanding the cam housings 102, 104 laterally with respect to the heat sink 30 and circuit board 14, 16. This lateral expansion causes the side edges 36, 38 of the heat sink 30 and cam housings 102, 104 to occupy substantially all of the space of the conventional rail provided in the chassis. Therefore, maximum surface contact and pressure is achieved between the edges 36, 38 of the heat sink 30 and the chassis.

The electrical circuit board assembly according to the invention utilizes a single buss bar to conduct electrical current to circuit modules provided on two closely adjacent circuit boards. Because of the large amount of heat which will likely be generated by the modules, the heat sink is provided immediately adjacent the modules and adapted to thermally conduct heat away from the circuit modules. As noted above, the buss bar is preferably imbedded into the heat sink. Preferably, the cover which encloses the buss bar in the heat sink recess is electrically insulated such that the buss bar is substantially encapsulated inside the thermally conductive heat sink. By enclosing the buss bar and imbedding it into the heat sink, the buss bar is effectively shielded from inadvertent contact by individuals or loose objects in and around the circuit board assembly.

Another advantage of the structure according to the invention is the ability to use a single buss bar and heat sink for two opposed, closely adjacent circuit boards. An electrical circuit assembly according to the invention effectively combines two circuit boards and modifies the structure of the heat sink and buss bar such that only a single buss bar and heat sink can be utilized for two different circuit boards. This results in material cost savings and weight reduction.

Still another advantage of the structure according to the invention is the adaptability of the structure. For example, if a buss bar is imbedded between a single circuit board and a heat sink, this single circuit board assembly could be easily modified to attach a second circuit board thereto and utilize the same buss bar by merely securing the second circuit board to the heat sink side of the original structure and electrically connecting the modules of the second board to the buss bar.

Reasonable variation and modification are possible within the spirit of the foregoing specification and drawings without departing from the scope of the invention.

The embodiments for which an exclusive property or privilege is claimed are defined as follows:

1. In an improved electrical circuit board assembly comprising a first circuit board having a front surface and a rear surface, a second circuit board having a front surface and a rear surface, the circuit boards being provided parallel to one another such that the rear surfaces are opposed and adjacent to one another, and a plurality of circuit modules provided on at least one of the surfaces of the first and second circuit boards, the improvement comprising:

a buss bar provided intermediate the first and second circuit boards and adjacent to the rear surface of the first circuit board, the buss bar being electrically connected to at least one of the circuit modules provided on the first circuit board and at least one of the circuit modules provided on the second circuit board;

a heat sink provided intermediate the first and second circuit boards and adjacent to both the buss bar and the rear surface of the second circuit board, the heat sink being adapted to thermally conduct heat from the buss bar and circuit modules away therefrom and comprising front and rear surfaces; and a cover provided on the front surface of the heat sink, the cover having at least one aperture formed therein for receipt of an electrical connection extending between the buss bar and at least one of the circuit modules of the first circuit board, so that the buss bar can be electrically connected to circuit modules provided on both the first and seconds circuit boards.

2. An improved electrical circuit board assembly according to claim 1 wherein eight apertures are formed in the cover and eight circuit modules are provided on the first circuit board and are electrically connected to the buss bar through eight electrical connection conduits extending through the eight apertures between the buss bar and the cover.

3. An improved electrical circuit board assembly according to claim 1 wherein the cover, in cooperation with the heat sink, substantially encloses the buss bar.

4. An improved electrical circuit board assembly according to claim 1 and further comprising insulating material provided between the cover and the buss bar such that the buss bar and heat sink are electrically insulated from one another.

5. An improved electrical circuit board assembly according to claim 4 and further comprising insulating material provided between the heat sink and the buss bar such that the buss bar and heat sink are electrically insulated from one another.

6. In an improved electrical circuit board assembly comprising a first circuit board having a front surface and a rear surface, a second circuit board having a front surface and a rear surface, the circuit boards being provided parallel to one another such that the rear surfaces are opposed and adjacent to one another, and a plurality of circuit modules provided on at least one of the surfaces of the first and second circuit boards, the improvement comprising:

a buss bar provided intermediate the first and second circuit boards and adjacent to the rear surface of the first circuit board, the buss bar being electrically connected to at least one of the circuit modules provided on the first circuit board and at least one of the circuit modules provided on the second circuit board;

a heat sink provided intermediate the first and second circuit boards and adjacent to both the buss bar and the rear surface of the second circuit board, the heat sink being adapted to thermally conduct heat from the buss bar and circuit modules away therefrom; and a cover provided on the front surface of the heat sink, the cover having at least one aperture formed therein for receipt of an electrical connection extending between the buss bar and at least one of the circuit modules of the first circuit board, so that the buss bar can be electrically connected to circuit modules provided on both the first and seconds circuit boards;

the heat sink comprising eight apertures and eight circuit modules are provided on the second circuit board and are electrically connected to the buss bar through eight electrical connection conduits extending through the eight apertures between the buss bar and the heat sink.

7. An improved electrical circuit board assembly according to claim 6 wherein eight circuit modules are provided on the first circuit board and electrically connected to the buss bar.

8. An electrical circuit board assembly comprising:

a first circuit board having a front surface, a rear surface and at least two circuit modules electrically connected to at least one of the front and rear surfaces;

a buss bar provided adjacent the rear surface of the first circuit board, the buss bar having a plurality of terminals provided thereon which are electrically connected to circuit modules on the first circuit board; and a heat sink having front and rear surfaces provided adjacent the buss bar such that the buss bar is intermediate the heat sink and rear surface of the first circuit board and the heat sink is thermally connected to the circuit modules such that the heat sink is adapted to thermally conduct heat away from the circuit modules; and a cover provided on the front surface of the heat sink, the cover having at least one aperture formed therein receiving at least one terminal extending from the buss bar to at least one of the circuit modules of the first circuit board, so that the buss bar can be electrically connected to circuit modules provided on both the front and rear surfaces first circuit board.

9. An electrical circuit board assembly according to claim 8 wherein the cover, in cooperation with the heat sink, substantially encloses the buss bar.

10. An electrical circuit board assembly according to claim 8 and further comprising insulating material provided between the cover and the buss bar such that the buss bar and heat sink, are electrically insulated from one another.

11. An electrical circuit board assembly according to claim 10 and further comprising insulating material provided between the heat sink and buss bar such that the buss bar and heat sink are electrically insulated from one another.

12. An electrical circuit board assembly comprising:

first and second circuit boards, each having at least one circuit module provided thereon;

a buss bar provided intermediate the two circuit boards, the buss bar having a plurality of terminals provided thereon which are electrically connected to circuit modules on both the first and second circuit boards;

a heat sink provided intermediate the two circuit boards, the heat sink being thermally connected to the circuit modules and adapted to thermally conduct heat away from the circuit modules, the heat sink having at least one aperture provided therein for the receipt of at least one buss bar terminal extending from the buss bar to at least one of the circuit modules of the second circuit board and a depression formed in a front surface thereof, the depression being adapted to receive at least a portion of the buss bar therein;

insulating material provided between the heat sink and buss bar such that the buss bar and heat sink are electrically insulated from one another;

a cover provided on the front surface of the heat sink, the cover having at least one aperture formed therein for receipt of at least one terminal extending from the buss bar to at least one of the circuit modules of the first circuit board; and insulating material provided between the cover and the buss bar such that the buss bar and heat sink are electrically insulated from one another.

* * * * *